(12) United States Patent
Fay

(10) Patent No.: US 6,780,751 B2
(45) Date of Patent: Aug. 24, 2004

(54) METHOD FOR ELIMINATING VOIDING IN PLATED SOLDER

(75) Inventor: Owen Fay, Gilbert, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 0 days.

(21) Appl. No.: 10/267,453

(22) Filed: Oct. 9, 2002

(65) Prior Publication Data

US 2004/0072416 A1 Apr. 15, 2004

(51) Int. Cl.$^7$ .................. H01L 21/4763; H01L 21/461
(52) U.S. Cl. ............... 438/613; 438/612; 438/614; 438/745; 438/749; 438/751; 438/754
(58) Field of Search ................... 438/612–617, 438/745, 749, 751, 754

(56) References Cited

U.S. PATENT DOCUMENTS

| | | | |
|---|---|---|---|
| 4,950,623 | A | 8/1990 | Dishon |
| 5,162,257 | A | 11/1992 | Yung |
| 6,251,501 | B1 * | 6/2001 | Higdon et al. |
| 6,293,457 | B1 * | 9/2001 | Srivastava et al. |
| 6,555,459 | B1 * | 4/2003 | Tokushige et al. |

OTHER PUBLICATIONS

Chemelex Product Data Sheet, Circutek ME–600, RBP Chemical Technology, Milwaukee, WI, Feb. 15, 2002, 2 pages.

"Lead Free Electronics Assembly: How Will This Unfold?," Prismark Partners LLC, May 2002, pp. 1–12.

"Implementing Cleaner Printed Wiring Board Technologies: Surface Finishes," Design for the Environment Printed Wiring Board Project, U.S. Environmental Protection Agency, Mar. 2000, pp. 1–41.

* cited by examiner

*Primary Examiner*—Ha Tran Nguyen
(74) *Attorney, Agent, or Firm*—Hulsey Grether & Fortkort LLP; John A. Fortkort

(57) ABSTRACT

A method for plating solder is provided. In accordance with the method, a die having a seed metallization thereon is provided. The seed metallization is microetched (85) with a solution comprising an acid and an oxidizer, thereby forming an etched seed metallization. An under bump metallization (UBM) is then electroplated (87) onto the etched seed metallization, and a lead-free solder composition, such as SnCu, is electroplated (91) onto the UBM. A method for reflowing solder is also provided, which may be used in conjunction with the method for plating solder. In accordance with this later method, the substrate is subjected to a seed metallization etch (137), followed by a microetch (141). A solder flux is then dispensed onto the substrate (147) and the solder is reflowed (149).

18 Claims, 8 Drawing Sheets

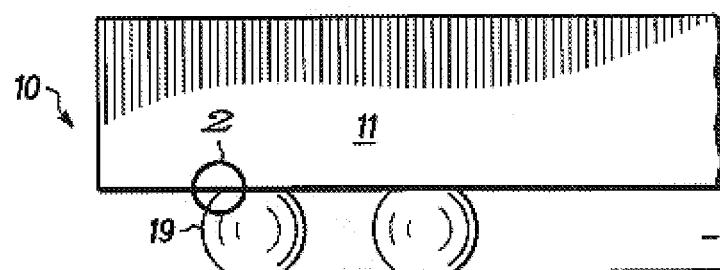
FIG. 1 - PRIOR ART -
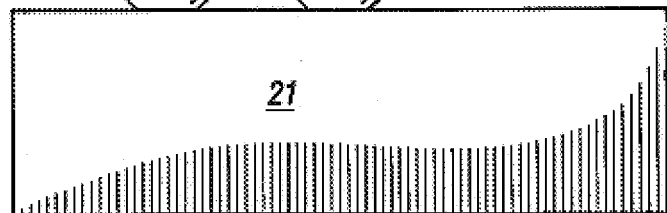
FIG. 2 - PRIOR ART -
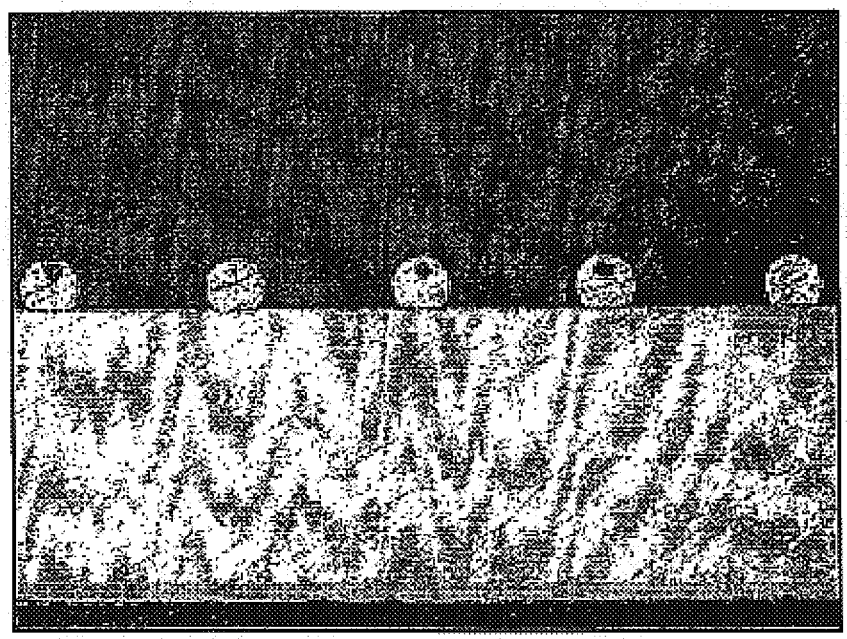
FIG. 3 - PRIOR ART -

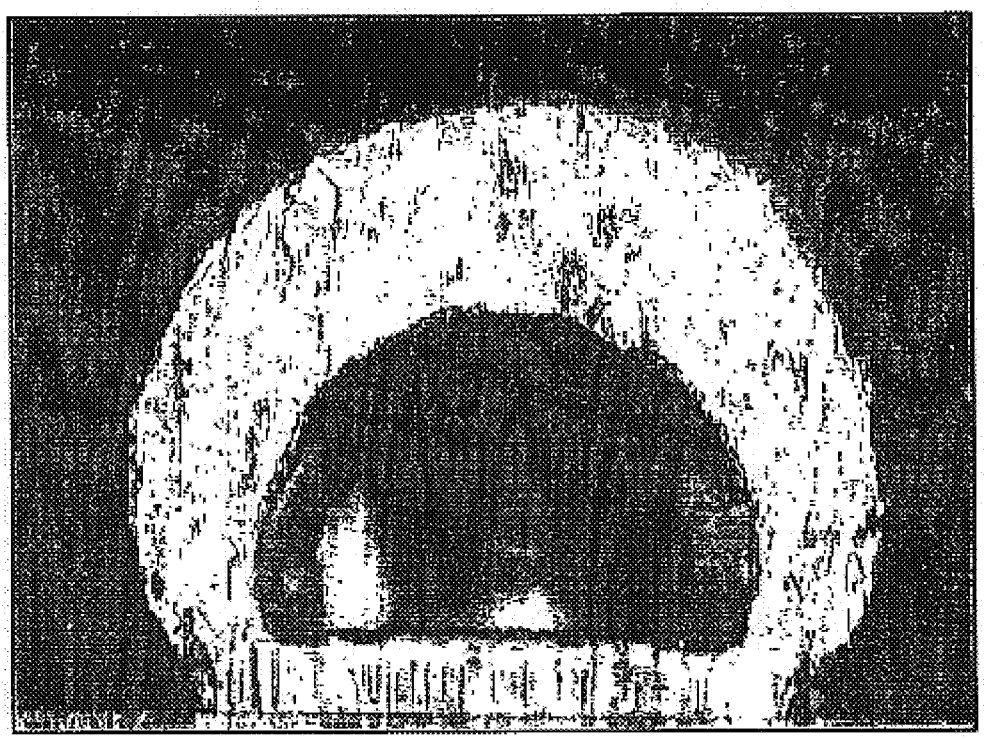
FIG. 4 - PRIOR ART -
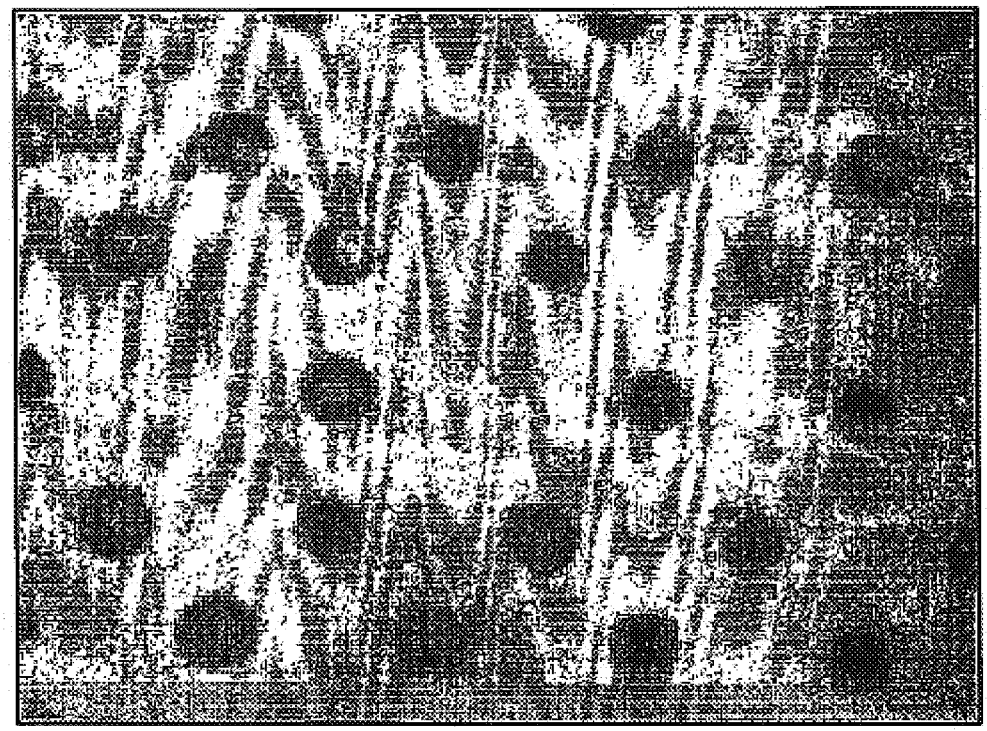
FIG. 5 - PRIOR ART -

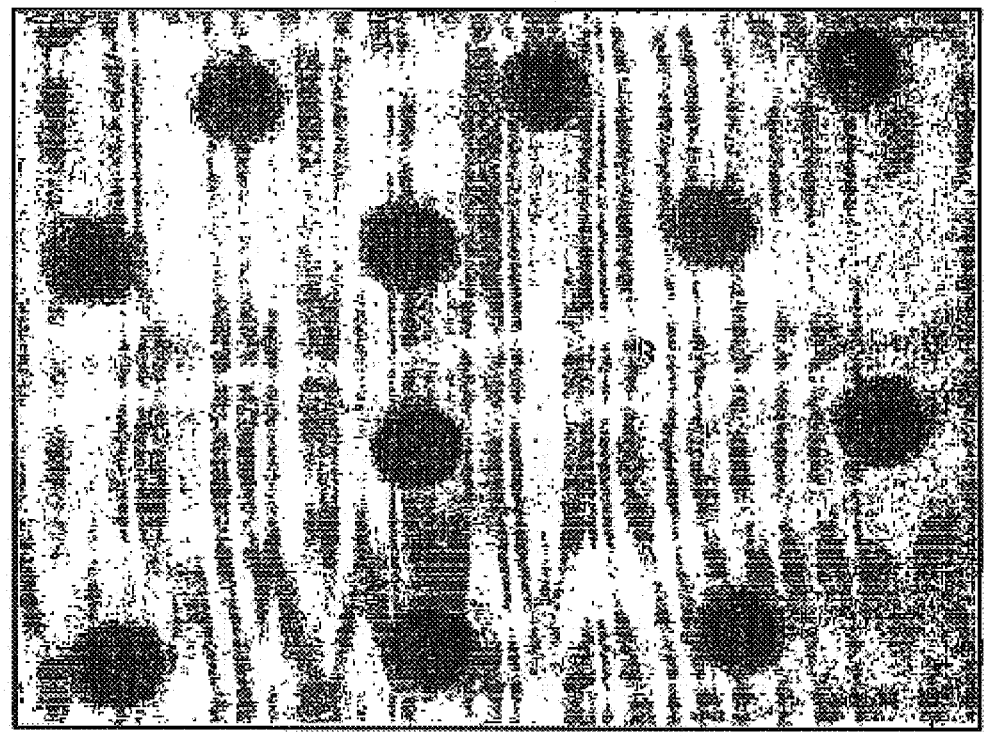
FIG. 6
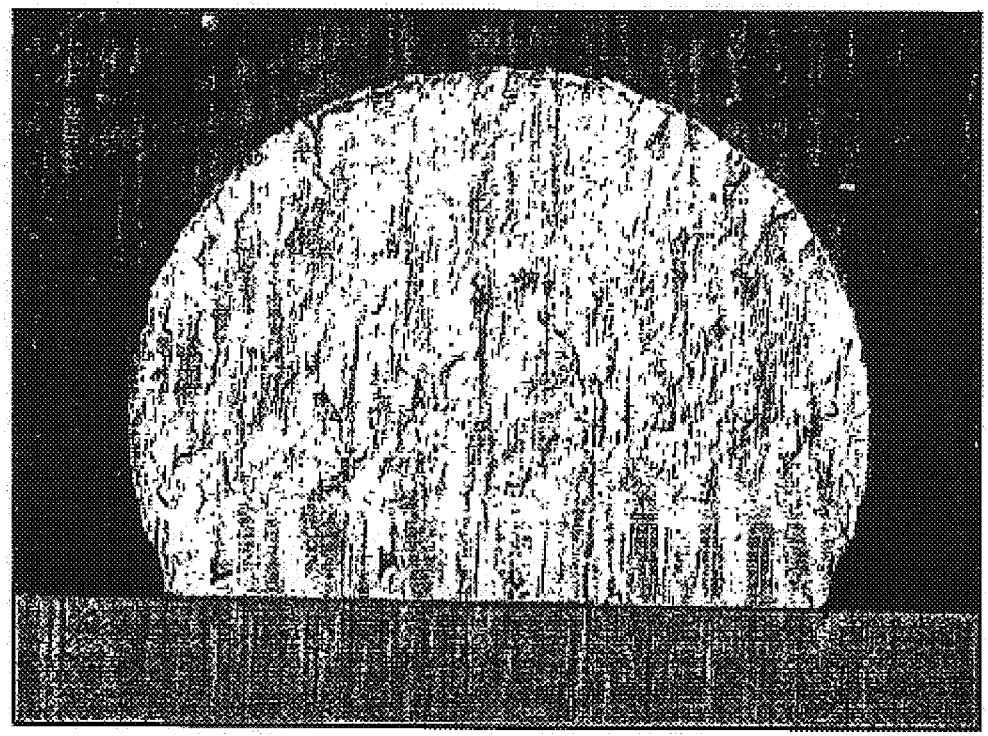
FIG. 7 - PRIOR ART -

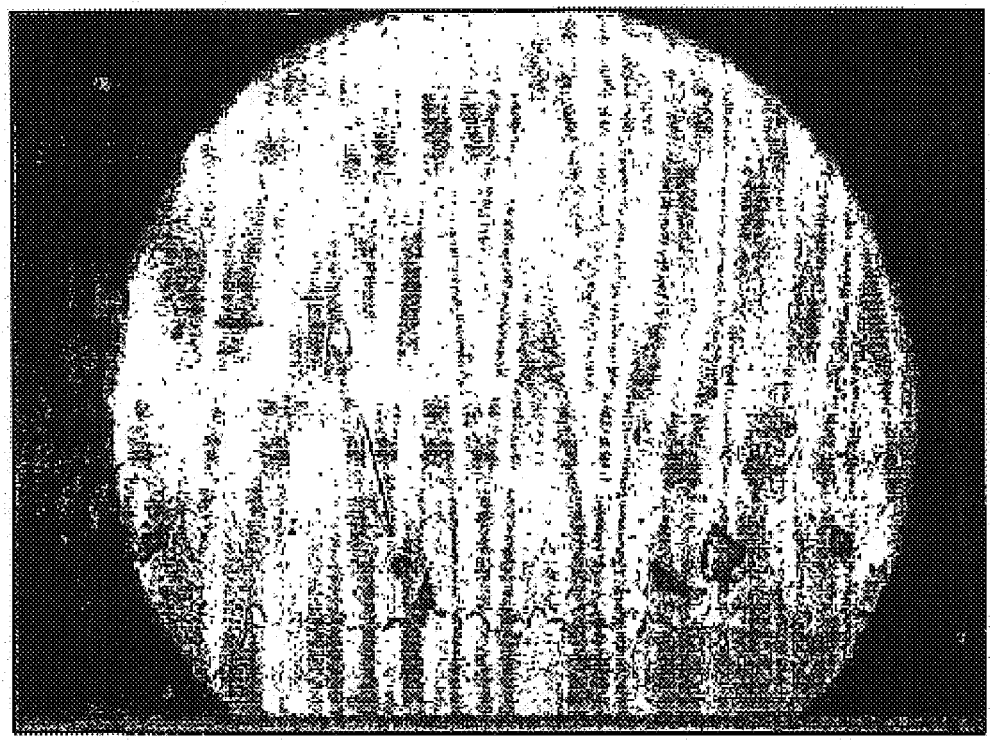
FIG. 8
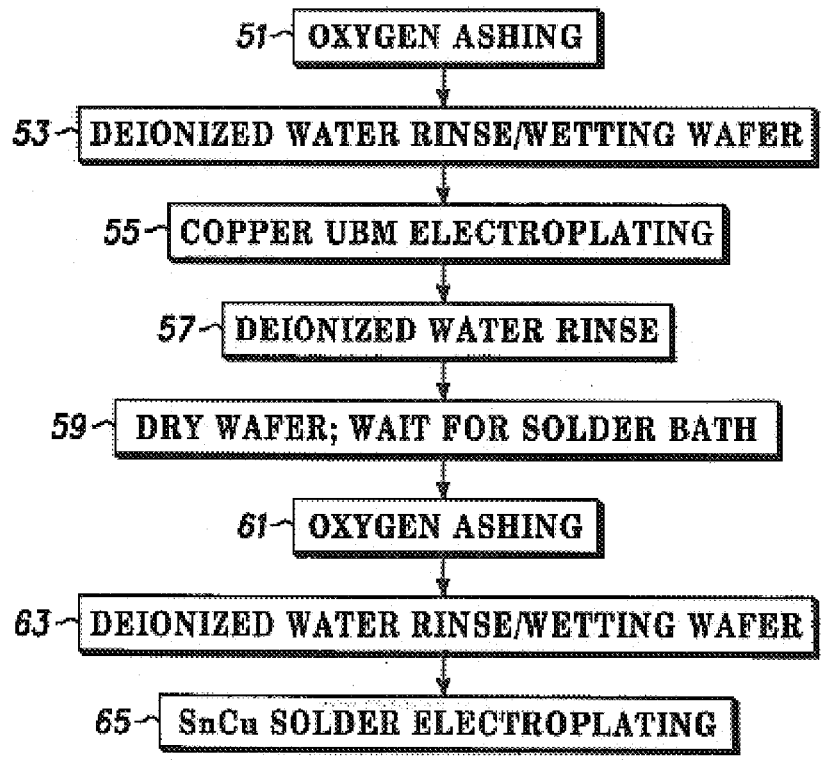
FIG. 9 - PRIOR ART -

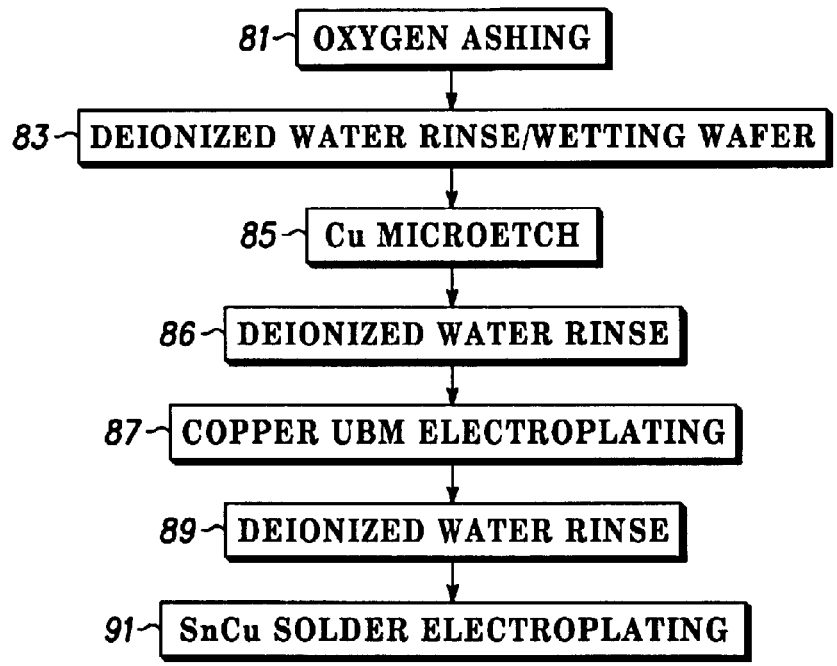
FIG. 10
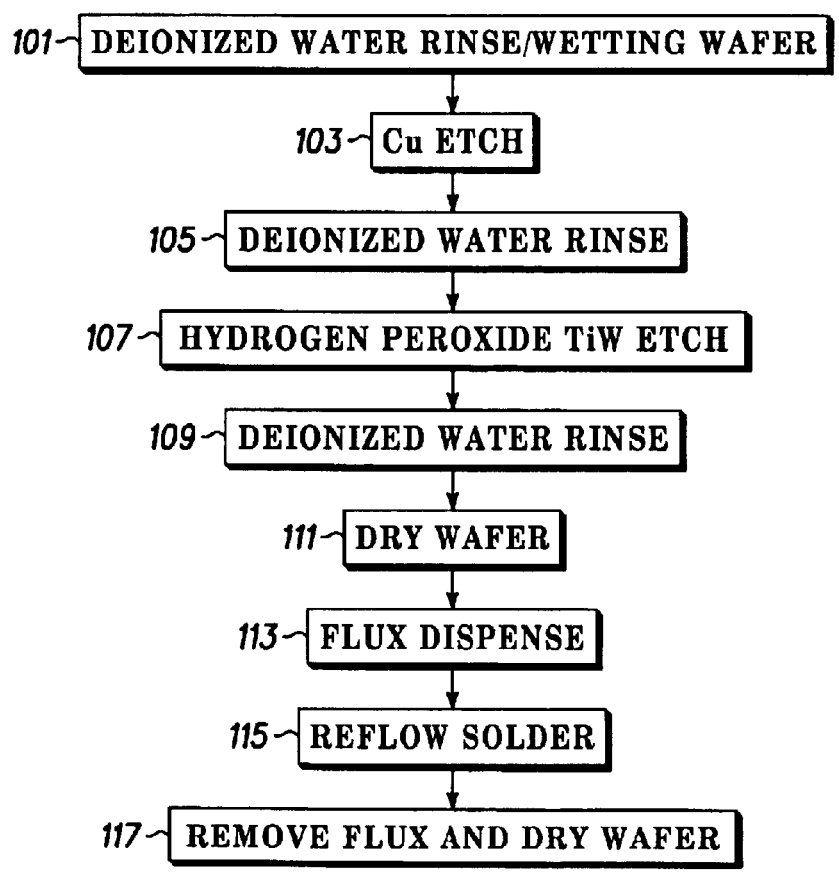
FIG. 11 - PRIOR ART -

METHOD FOR ELIMINATING VOIDING IN PLATED SOLDER

FIELD OF THE INVENTION

The present invention relates generally to solder joints and to methods for forming the same, and relates more particularly to methods for preparing an under bump metallization layer for solder plating and reflow.

BACKGROUND OF THE INVENTION

The use of solder bumps in attaching die to flip-chip packaging is well known in the art. FIG. 1 and FIG. 2 (the later of which is a magnified view of REGION 2 of FIG. 1) illustrate one type of prior art solder joint 10 that is used in flip chip applications. As shown therein, a die 11 is provided which has an I/O pad or die pad 13 disposed thereon. A photo polymer passivation layer 17 is provided to protect the die from damage. A seed metallization 14 is disposed on the die pad, and an Under Bump Metallization (UBM) layer 15 is disposed on the seed metallization. A solder ball 19 is then placed or formed on top of the UBM structure and is bonded to the underlying UBM through reflow (that is, by heating the solder composition sufficiently so that it liquefies). The solder ball is used to form an electrical and mechanical connection between the die and a Printed Circuit Board (PCB) 21 or other device.

There is currently a movement in the art to replace tin-lead solders that have been widely used in die attach operations with lead-free solders, due to the health and environmental problems that lead-based solders pose. Indeed, the National Electronics Manufacturing Initiative (NEMI) has formally endorsed the use of certain lead-free solders, and in particular, tin-based lead-free solders, for various applications. Thus, for example, NEMI has advocated the use of $SnAg_{3.9}Cu_{0.6}$ in solder reflow operations used in conjunction with most of the PC boards produced today, and is also recommending two other lead-free alloys, $SnCu_{0.7}$ and $SnAg_{3.5}$, for wave soldering applications.

However, while these tin-based solders have a number of advantageous properties, they also suffer from some infirmities. In particular, solder joints based on these materials are often found to have lifetimes that are significantly shorter than projected lifetimes based on theoretical considerations. In other words, the incidence of solder joint failure per unit time for solder joints based on these materials is often found to be unexpectedly high.

There is thus a need in the art for improved solder joints based on lead-free solders (particularly lead-free tin-based solders) that exhibit longer lifetimes. There is also a need in the art for a method for achieving such solder joints. These and other needs are met by the methodologies described herein.

SUMMARY OF THE INVENTION

In one aspect, a method for plating solder onto a die is provided. The method is particularly useful with lead-free solders, such as SnCu, SnAg and SnAgCu. In accordance with the method, a die is provided which has a seed metallization thereon. The seed metallization preferably comprises a first layer of TiW and a second layer of copper, and also preferably has a photoresist disposed thereon which has been patterned to create at least one aperture through which a portion of the seed metallization is exposed. The exposed seed metallization is etched with a (preferably dilute, aqueous) solution comprising an acid (such as, for example, sulfuric acid) and an oxidizer (such as, for example, sodium persulfate), thereby forming an etched seed metallization. An under bump metallization (UBM) which preferably comprises copper is then electroplated onto the etched seed metallization. The wafer is then preferably rinsed with deionized water, and a solder composition (preferably lead-free) is electroplated onto the UBM.

In another aspect, a method for etching a UBM is provided. In accordance with the method, a die is provided having a seed metallization, a UBM disposed on the seed metallization, and a lead-free solder composition disposed on the UBM. The seed metallization is then etched and possibly rinsed, and the UBM is etched with a solution comprising an acid and an oxidizer. A solder flux is then dispensed onto the die, and the solder composition is reflowed.

In still another aspect, a method for plating solder on a die is provided. In accordance with the method, a die is provided which has a die pad disposed thereon. A seed metallization is formed over the die pad, and a photo-definable polymer is disposed over the seed metallization. The photo-definable polymer is then patterned and exposed to create an aperture which exposes at least a portion of the seed metallization, after which the exposed portion of the seed metallization is etched with a solution comprising an acid and an oxidizer. A UBM, which preferably comprises copper, is then electroplated onto the etched portion of the seed metallization, and a (preferably lead-free) solder composition is electroplated onto the UBM.

In still another aspect, a method for electroplating a solder composition is provided. In accordance with the method, a substrate is provided which has a seed metallization disposed thereon. The seed metallization is then etched with a solution comprising an acid and an oxidizer, and a copper UBM is electroplated onto the seed metallization.

These and other aspects of the present disclosure are described in greater detail below.

BRIEF DESCRIPTION OF THE DRAWINGS

FIGS. 1 and 2 are schematic diagrams illustrating a commonly used procedure for attaching die to flip-chip packaging with solder bumps;

FIGS. 3 and 4 are cross-sectional micrographs which show the presence of voiding in reflowed SnCu solder plated in accordance with a prior art plating process;

FIG. 5 is a fine focus x-ray (top view) illustrating the presence of voiding after reflow in solder bumps plated in accordance with a prior art methodology;

FIG. 6 is a fine focus x-ray (top view) illustrating the absence of voiding after reflow in solder bumps plated in accordance with the teachings herein;

FIG. 7 is a cross-sectional micrograph of a lead-free solder bump (with a copper UBM and TiW/Cu seed metallization) which has been treated with a prior art seed metallization etching process prior to solder reflow, and which exhibits poor wetting of the sides of the UBM;

FIG. 8 is a cross-sectional micrograph of a lead-free solder bump (with a copper UBM and TiW/Cu seed metallization) which has been treated with a seed metallization etching process in accordance with the teachings herein;

FIG. 9 is a flow chart illustrating a prior art method for electroplating lead-free solder;

FIG. 10 is a flow chart illustrating a method for electroplating lead-free solder in accordance with the teachings herein;

FIG. 11 is a flow chart illustrating a prior art method for seed metallization etching;

DETAILED DESCRIPTION

It has now been found that the unexpectedly high incidence of solder joint failure observed with lead-free solders, and especially lead-free tin-based solders, is due to at least two factors. First of all, it has been found that tin-based lead-free solders are often prone to voiding during reflow. Examples of solder balls which exhibit such voiding are shown in FIGS. 3 and 4 (the voiding appears as dark spots in FIG. 3, and as a dark hemisphere in FIG. 4). Voiding of this type seriously degrades the mechanical integrity of solder joints, thus causing solder joint failure during thermal cycling and reducing the life of the solder joint. This voiding has now been linked to the conventional plating processes used to plate solder onto the Under Bump Metallization (UBM). A typical example of such a conventional plating process is illustrated in FIG. 9 herein.

The second factor that has been found to result in unexpectedly high incidences of solder joint failure with lead-free solder compositions is the tendency of these solder compositions to incompletely wet the Under Bump Metallization (UBM) during conventional reflow after conventional seed metallization etching processes. When the UBM is in the form of a copper post, this problem is especially noticeable on the sides of the post, as shown in FIG. 7. As a result of this tendency, the solder-to-copper interface occurs over a smaller area and therefore has diminished strength, and the life of the joint is reduced accordingly.

It has now been discovered that the above-noted problems can be avoided through suitable modifications to the conventional solder plating and seed metallization etching processes typically used in the formation of solder joints. In particular, it has been found that the above-noted problems can be overcome through the selective use of microetching (and, in the case of solder plating, elimination of a drying step) in these processes. These modifications to the conventional solder plating and seed metallization etching processes are described in greater detail below.

Figure 13:
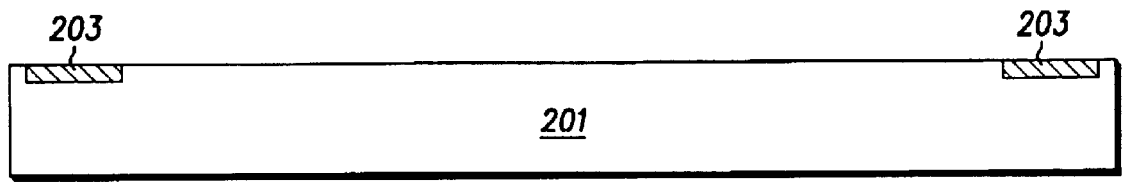
FIGS. 13–21 are illustrations of a method for making a solder joint with a UBM.
Figure 14:
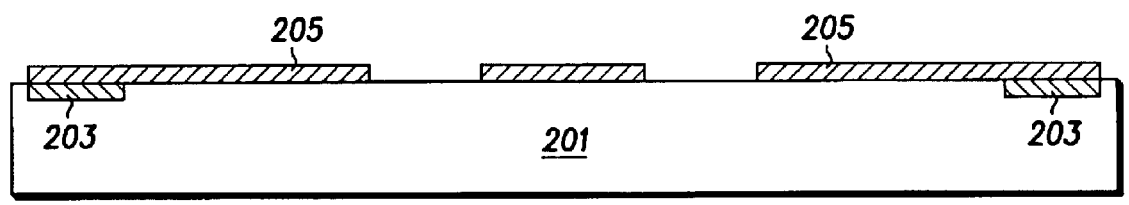

The methods described herein may be understood in the context of the general method illustrated in FIGS. 13–21 for making a solder joint with a UBM. With reference to FIG. 13, a die 201 having peripheral die pads 203 thereon is provided. In order to provide for proper placement and pitch of the solder bumps that are to be introduced at a later stage, the metal die pads are redistributed to form the redistributed die pads 205 shown in FIG. 14.

Figure 15:
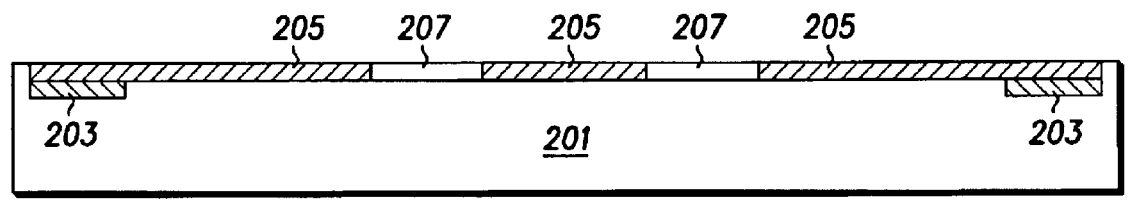
Figure 16:
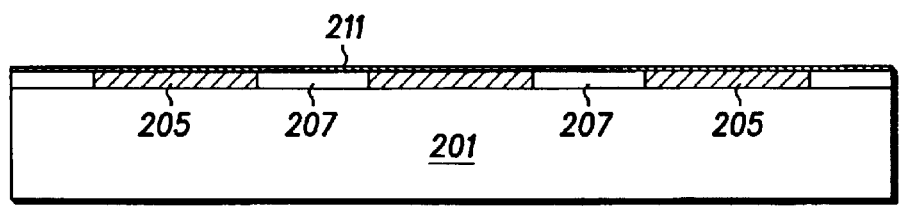
Figure 17:
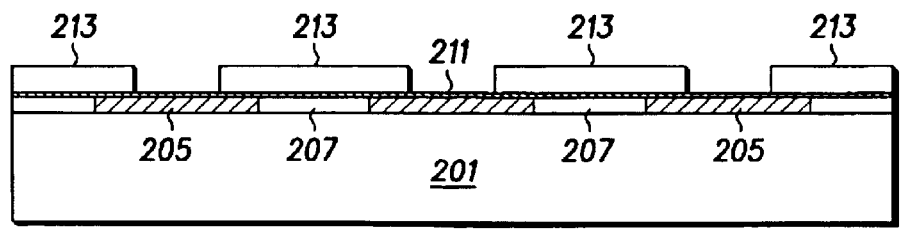
Figure 18:
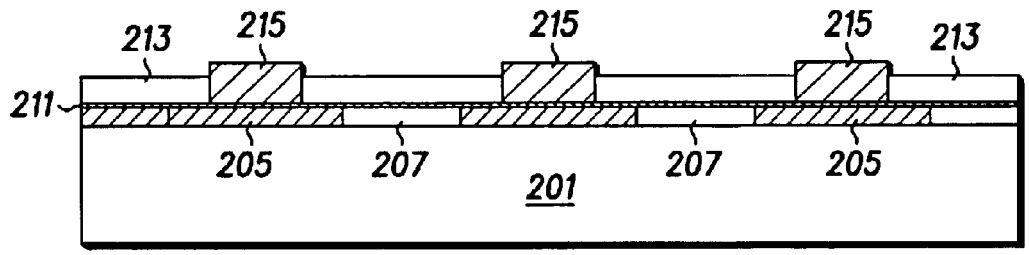
Figure 19:
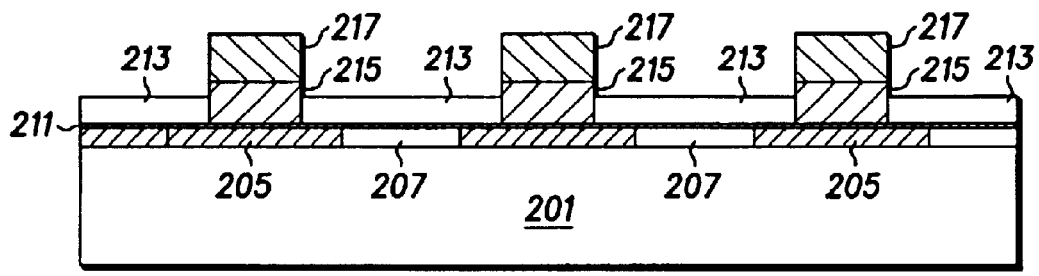

As shown in FIG. 15, a photo-definable encapsulation layer 207, which may be, for example, a Stress Compensation Layer (SCL), is coated onto the die substrate and patterned, after which a seed metallization 211 comprising a first layer of TiW and a second layer of Cu is sputtered onto the resulting article as shown in FIG. 16. A layer of photoresist 213 is then coated and patterned over the seed metallization as shown in FIG. 17, and the UBM 215 is formed over the exposed seed metallization, as shown in FIG. 18, by electroplating with a copper solution. A layer of solder 217 such as SnCu is then electroplated over onto the UBM as shown in FIG. 19.

Figure 20:
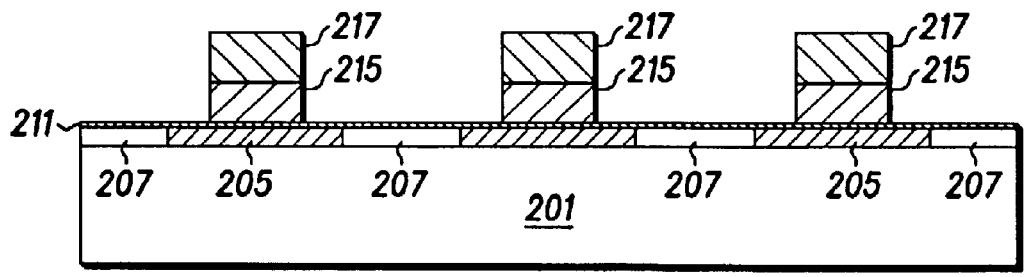
Figure 21:
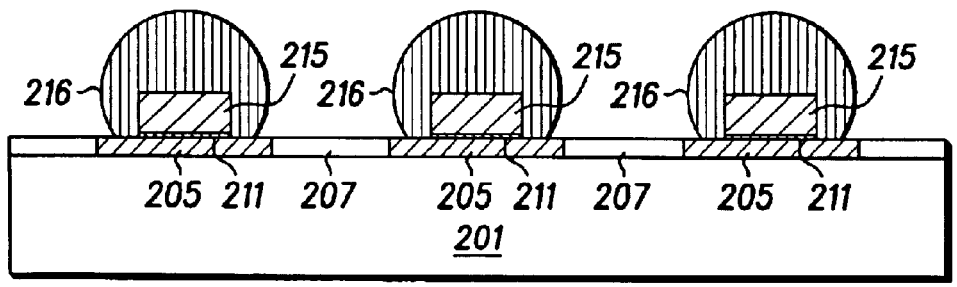

As shown in FIG. 20, the photoresist is then stripped, through the application of a solvent or by other suitable means. The seed metallization is then etched as shown in FIG. 21 to electrically isolate each die pad. The TiW portion of the seed metallization may be etched with, for example, a hydrogen peroxide solution, while the Cu portion of the seed metallization may be etched with, for example, a dilute aqueous solution of ammonium carbonate, ammonium hydroxide and sodium chlorite. The solder is then reflowed as shown in FIG. 21 to yield a series of solder bumps 216. The resulting structure may then be cleaned as necessary.

FIG. 9 illustrates a conventional process typically used to plate a solder composition onto a UBM. The process is typically employed after formation of the seed metallization, and after a photoresist has been deposited and patterned on the wafer to selectively expose portions of the seed metallization (e.g., after a substrate of the type depicted in FIG. 17 has been formed). The seed metallization used in this process usually contains a first layer of TiW and a second layer of Cu. The TiW layer, which is typically about 2000 Å thick, facilitates adhesion of the UBM to the die pad while also acting as a Cu barrier, while the Cu layer, which is typically about 5000 Å thick, provides sufficient conductivity for the UBM plating operation.

The process typically begins with oxygen ashing 51 (that is, treatment of the wafer with oxygen plasma), followed by rinsing 53 the wafer with deionized water. These steps remove any organic impurities present on the chip, and thus ensure that the seed metallization will be sufficiently hydrophilic for the subsequent electroplating operations.

A UBM in the form of a copper post is then electroplated 55 onto the portion of the seed metallization exposed by the photoresist. The wafer is then rinsed 57 with deionized water, and is dried 59 in preparation for the solder bath. Since there may be a significant interval (sometimes several days) between formation of the UBM and commencement of solder electroplating, the wafer is typically subjected to a second oxygen ashing step 61 to remove any organic impurities that may have accumulated on the wafer during that interval, which impurities would tend to detrimentally affect the wetting characteristics of the wafer. The wafer is then rinsed with deionized water 63, and the solder composition such as SnCu is electroplated onto the UBM. The photoresist is then stripped from the wafer, and the wafer is processed through seed metallization etching and solder reflow.

As noted previously, if the foregoing process sequence is used to electroplate lead-free solders such as SnCu, SnAg and SnAgCu onto copper UBMs, substantial voiding can occur in the reflowed solder. Specific examples of such voiding in reflowed SnCu solder balls (similar voiding is observed in SnAg and SnAgCu solder balls after reflow) which were plated in accordance with the methodology depicted in FIG. 9 are illustrated in the cross-sectional micrographs of FIGS. 3 and 4, where the voids appear as blackened areas within the solder bump. The incidence of voiding can be quite widespread when this electroplating process is used. Thus, FIG. 5 depicts a fine focus x-ray (top view) of a series of solder bumps plated in accordance with the methodology of FIG. 9. In the x-ray, voiding appears as lightened portions within the solder bumps (that is, solder bumps that are free of voids are completely darkened). Of the 22 solder bumps that are completely visible in the x-ray, 12 (more than half) exhibit substantial voiding.

FIG. 10 illustrates one embodiment of a plating process in accordance with the present invention. As with the method depicted in FIG. 9, this process is typically employed after the seed metallization has been formed (but prior to being etched) and after the photoresist used to form a plating mask has been deposited and patterned on the wafer.

The process of FIG. 10 begins with oxygen ashing 81, after which the wafer is rinsed 83 (typically with deionized water). The exposed portions of the seed metallization are then microetched 85 (the microetch may involve, for example, treatment of the substrate with a solution comprising 1% sulfuric acid and 0.25% sodium persulfate in deionized water, with about 0.01% copper sulfate added as a stabilizer), and rinsed 86 with deionized water, after which the UBM (which preferably comprises copper) is electroplated 87 onto the freshly etched surface of the seed metallization. The wafer is then rinsed 89 once more (again preferably with deionized water), but is not dried, and the solder (preferably a lead-free solder such as SnCu) is promptly electroplated 91 onto the UBM. The photoresist is then stripped from the wafer, and the wafer is processed through seed metallization etching and solder reflow.

The method depicted in FIG. 10 differs in some key aspects from the method depicted in FIG. 9. For example, in the method depicted in FIG. 10, the wafer (and in particular, the seed metallization) is subjected to a microetch prior to UBM electroplating. The use of a microetch at this point in the process is found to significantly improve the adhesion between the UBM and the seed metallization, while at the same time reducing voiding in the reflowed solder. Without wishing to be bound by theory, it is believed that this microetch effectively removes metal oxides from the surface of the seed metallization that would otherwise contribute to voiding, while at the same time improving adhesion between the UBM and the seed metallization by providing a fresh, non-oxidized layer of metal (e.g., copper) to plate the UBM onto. Accordingly, it is preferred that UBM plating is conducted shortly after the microetch so that metal oxides will not have a chance to reform on the surface of the seed metallization.

The method of FIG. 10 also differs from the method depicted in FIG. 9 in that the wafer is not dried after the final rinse. Rather, solder plating (for example, using SnCu) is conducted shortly after the wafer is rinsed. Without wishing to be bound by theory, it is believed that, by avoiding the drying step (and in particular, by proceeding to the plating process before the wafer is dried), the formation of metal oxides during drying, which could contribute to voiding, is precluded.

If the plating process of FIG. 10 is used to plate a lead-free solder onto a copper UBM, then voiding in the reflowed solder bumps is virtually eliminated. This effect is illustrated by the fine focus x-ray of FIG. 6, which was taken of a series of reflowed solder bumps plated in accordance with the methodology of FIG. 10. As seen therein, all 11 of the solder bumps visible in the x-ray are completely darkened, thus indicating a complete absence of any discernible voiding.

As noted above, in the method depicted in FIG. 10, solder plating is conducted shortly after the UBM is plated onto the wafer and the wafer is rinsed, and thus the typical drying step from the prior art method (see FIG. 9) is eliminated. In some circumstances, however, it may not be possible to avoid drying the wafer (or allowing the wafer to dry) between the two plating processes. This may be the case, for example, if it is not possible to conduct both plating operations at the same location, or as parts of a continuous process. In such cases, the process of FIG. 10 may be modified slightly by subjecting the dried wafer, prior to solder plating, to oxygen ashing followed by a microetch. While this modified process may allow some voiding to occur in the reflowed solder and hence is less preferable than the method of FIG. 10, the voids in a solder joint made in accordance with this modified process are typically much smaller than those that typically occur in prior art processes of the type depicted in FIG. 9, and are therefore acceptable in some applications.

Thus far, improvements in solder joint reliability that may be achieved in accordance with the teachings herein have dealt with processing steps that precede the solder plating process. However, additional improvements in solder joint reliability, especially for solder joints based on lead-free solders, are possible through modifications to the standard seed metallization etching process that occur after solder plating but before solder reflow. While these modifications to the standard seed metallization etching process can by themselves result in improvements in solder joint lifetimes, it is preferred that they are used in conjunction with the improved solder plating processes described above.

FIG. 11 illustrates a conventional process used for seed metallization etching, wherein the seed metallization is copper on TiW. The process is typically employed after a solder electroplating process such as the type described in FIG. 9 and after the photoresist has been stripped (e.g., after a structure of the type depicted in FIG. 20 has been formed). As seen therein, at the beginning of the process, the wafer is rinsed 101 with deionized water. The seed metallization is then subjected to a copper etch 103 using a dilute aqueous solution of ammonium carbonate, ammonium hydroxide and sodium chlorite. The wafer is again rinsed 105 with deionized water and the seed metallization is subjected to a TiW etch 107 with an aqueous solution of hydrogen peroxide, after which the wafer is again rinsed 109 with deionized water. The wafer is then dried 111, a solder flux is dispensed 113 onto the wafer, and the solder is reflowed 115. The solder flux is then removed 117 and the wafer is dried.

As previously noted, if the processing steps of FIG. 11 are followed, the solder will often fail to completely wet the copper UBM during reflow. If the UBM is in the form of a copper post, this effect, which is illustrated by the cross-sectional micrograph of FIG. 7, will typically be most noticeable on the sides of the post. Without wishing to be bound by theory, it is believed that the lead-free solder does not wet the copper UBM completely due to the formation of a thick layer of copper oxides during the preceding hydrogen peroxide TiW etching. This oxide layer is often too thick to be completely removed by subsequent treatment with a solder flux, especially on the sides of the UBM. To the extent that any portion of this oxide layer remains, it tends to cause the UBM to resist wetting by the molten solder.

Figure 12:
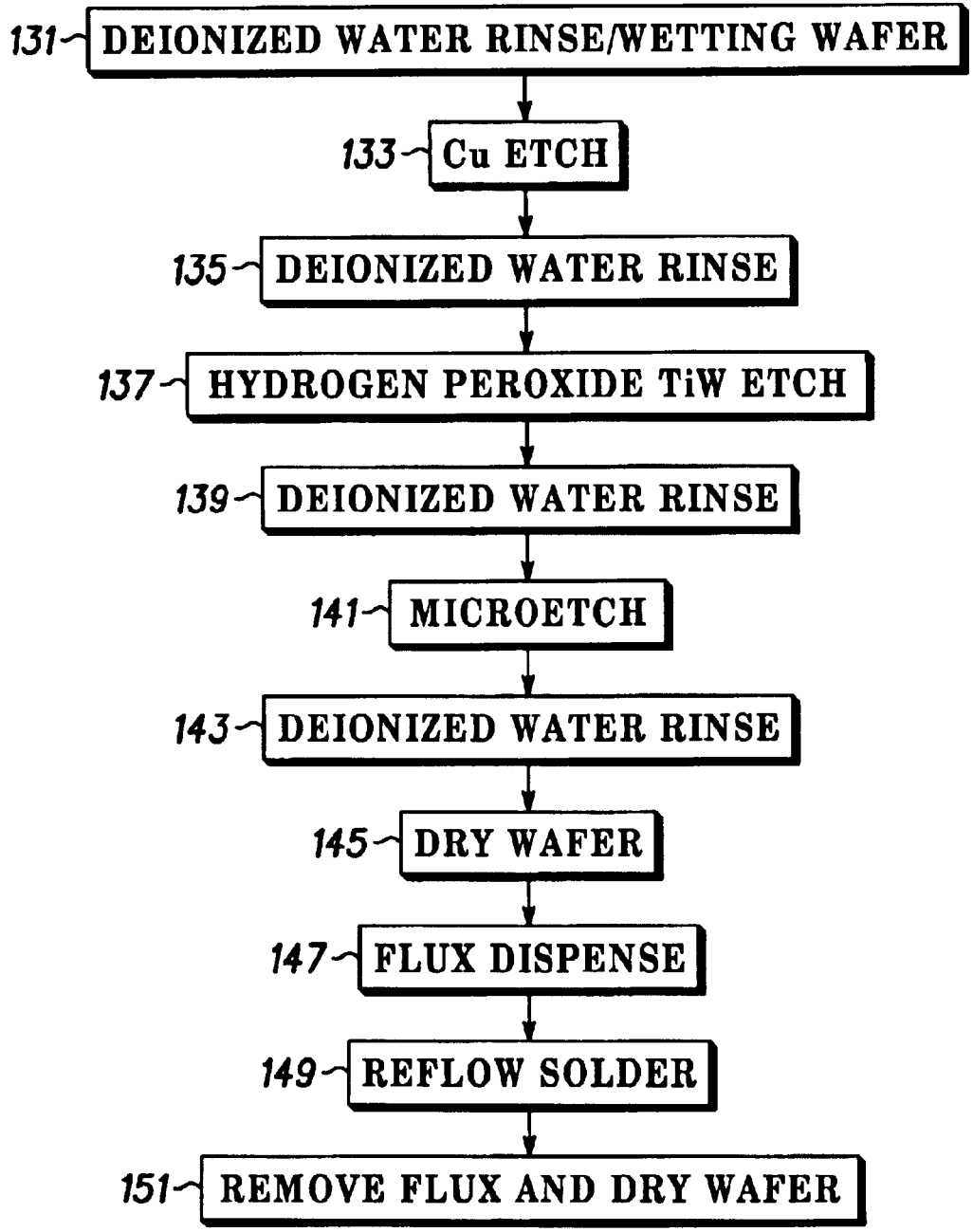
FIG. 12 is a flow chart illustrating a method for seed metallization etching in accordance with the teachings herein.

FIG. 12 illustrates one embodiment of a seed metallization etching process in accordance with the teachings herein. As with the method depicted in FIG. 11, this process is typically employed after solder electroplating (preferably in accordance with the method of FIG. 10), and commences with rinsing 131 the wafer. In the various rinsing steps of this process, the wafer is preferably rinsed with deionized water, though other cleaners or solvents as are known to the art could be used instead.

The seed metallization is then subjected to a copper etch 133 which may involve, for example, treatment with a dilute aqueous solution of ammonium carbonate, ammonium hydroxide and sodium chlorite. The wafer is rinsed 135 and the seed metallization is subjected to a TiW etch 137, preferably with an aqueous solution of hydrogen peroxide, after which the wafer is rinsed 139 once again. The wafer is then subjected to a microetch 141, after which it is rinsed 143 one more time. The wafer is then dried 145, a solder flux is dispensed 147 onto the plated solder, and the solder is reflowed 149. The solder flux is then removed 151, and the wafer is dried.

The method depicted in FIG. 12 differs from the method depicted in FIG. 11 in the use of a microetch after the TiW etch and subsequent rinse. When the seed metallization etching process of FIG. 12 is used prior to solder reflow, the solder is found to completely wet the UBM (including the sides thereof) as shown in FIG. 8. Without wishing to be bound by theory, this is believed to result from the removal by the microetch of metal oxides from the surfaces, and especially the sides, of the UBM so that the surfaces of the UBM are readily wetted by the solder composition during reflow. As a result, the surface area of the solder-to-copper interface is maximized, the solder joint has optimal strength, and the life of the solder joint is maximized.

Several solutions can be used to perform a microetch pursuant to the methods described herein. Preferably, the solution is an aqueous solution of an oxidizer and an acid, and more preferably, the solution is a dilute aqueous solution of an oxidizer and an acid. Most preferably, the microetch is a dilute aqueous solution of sodium persulfate in sulfuric acid, since this solution allows copper to be etched in a very controllable manner.

Although the use of sodium persulfate is preferred in the microetch solutions employed in the methods described herein, various other oxidizers may be used in the microetch solutions described herein. These include, for example, potassium or ammonium persulfate, cerric ammonium sulfate, chromic acid, hydrogen peroxide, potassium iodide, silver nitrate, iodine, ozone, oxygen, nitrous oxide, and ferric chloride. Various combinations of two or more of these oxidizers may also be used.

Similarly, although the use of sulfuric acid is preferred in the microetch solutions employed in the various methods described herein, various other acids may also be used to make the solution appropriately acidic. These include organic acids such as, for example, acetic acid, adipic acid, citric acid, formic acid, lactic acid, and oxalic acid, and inorganic acids, such as, for example, nitric acid, hydrochloric acid, boric acid, chromic acid, hydrobromic acid, hydrocyanic acid, hydrofluoric acid, phosphoric acid, and sulfonic acid. Various combinations of two or more of these acids may also be used.

The methodologies described herein may be used in solder plating and seed metallization etching operations that involve almost any type of solder, including tin-lead solders (SnPb) and other lead-based solders such as, for example, SnPbAg, SnPbAgSb, and SnPbSb solders. However, these methodologies are particularly useful when used in conjunction with lead-free solders, due to the ability of these methodologies to overcome infirmities that are especially prevalent in many lead-free solders. Examples of lead-free solders that may be used in conjunction with the methodologies described herein include, but are not limited to, SnCu, SnAg, SnAgCu, SnBi, SnAgBi, SnCuNi, SnSb, and SnBiAgCu. Of these solders, the use of the methodologies described herein with SnCu, SnAg, SnAgCu is preferred, and the use of these methodologies with SnCu is especially preferred.

The solder electroplating and seed metallization etching processes disclosed herein have been described primarily with reference to systems having copper UBMs. However, each of these methods may also be used in conjunction with systems having other types of UBMs, especially those comprising nickel. When the methods disclosed herein are used in conjunction with a nickel UBM, it is preferred to use dilute nitric acid as the microetch.

A method for electroplating solder onto a die has been provided herein. The method, which utilizes a microetch prior to UBM electroplating and which eliminates the drying step between UBM electroplating and solder electroplating typically found in prior art processes, is found to reduce the incidence of voiding that frequently accompanies the reflow of lead-free solder compositions, and to ensure a stronger bond between the seed metallization and the UBM. A method for etching a UBM has also been provided, which may be used alone or in combination with the previous method. This method, which utilizes a microetch of the UBM prior to solder reflow, is found to promote better wetting of the UBM, thereby resulting in solder joints that span a larger surface area and that exhibit greater average lifetimes.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for plating solder onto a die, comprising the steps of:

providing a die having a seed metallization thereon containing a first layer comprising TiW and a second layer comprising copper;

etching the seed metallization with a solution comprising an acid and an oxidizer, thereby forming an etched seed metallization;

electroplating an under bump metallization (UBM) onto the etched seed metallization, the UBM comprising copper;

electroplating a lead-free Bolder composition onto the UBM; and exposing the die to a seed metallization etch comprising a hydrogen peroxide solution, the etch resulting in essentially the complete removal of those portions of the seed metallization layer exposed to the etch.

2. The method of claim 1, wherein the seed metallization has a photoresist thereon which has been patterned to create an aperture which exposes at least a portion of the seed metallization, and wherein the exposed portion of the seed metallization is etched with the solution in the step of etching.

3. The method of claim 1, wherein the acid is sulfuric acid.

4. The method of claim 1, wherein the oxidizer is sodium persulfate.

5. The method of claim 1, wherein the lead-free solder is selected from the group consisting of SnCu, SnAg, and SnAgCu.

6. The method of claim 1, wherein the solution is a dilute aqueous solution comprising sulfuric acid and sodium persulfate.

7. The method of claim 1, wherein the die is exposed to a seed metallization etch after the lead-free solder composition is electroplated onto the UBM.

8. The method of claim 7 wherein, after the seed metallization etch, the die is subjected to a further etch with a solution comprising an acid and an oxidizer, after which the solder is reflowed.

9. The method of claim 1, further comprising the step of rinsing the die with deionized water after the UBM is electroplated onto the etched seed metallization but before the lead-free solder composition is electroplated onto the UBM, and wherein the die is not dried after it is rinsed with deionized water and before the lead-free solder composition is electroplated onto the UBM.

10. The method of claim 1, wherein the seed metallization is disposed over a die pad.

11. The method of claim 10, wherein the die is dried after the UBM is electroplated but before the solder composition is electroplated, and wherein the dried die is subjected, prior to solder plating, to oxygen ashing followed by etching of the UBM.

12. A method for etching an under bump metallization (UBM), comprising the steps of:

providing a die having a seed metallization, a UBM disposed on the seed metallization, and a lead-free solder composition disposed on the UBM, wherein the seed metallization comprises TLW and copper;

etching the seed metallization with a first solution comprising an aqueous mixture of ammonium carbonate, ammonium hydroxide and sodium chlorite;

etching the seed metallization with a second solution comprising a peroxide;

etching the UBM with a dilute solution comprising an acid and an oxidizer; and reflowing the solder composition.

13. The method of claim 12, wherein the UBM comprises copper, and wherein the seed metallization contains a first layer comprising TiW and a second layer comprising copper.

14. The method of claim 12, wherein the UBM comprises copper, and wherein the solution is adapted to remove copper oxides from the surface of the UMB.

15. The method of claim 12, wherein the UBM is etched with a dilute aqueous solution comprising sulfuric acid and sodium persulfate.

16. The method of claim 12, wherein the lead-free solder is selected from the group consisting of SnCu, SnAg, and SnAgCu.

17. The method of claim 12, wherein the seed metallization further comprises copper.

18. The method of claim 12 wherein, after the lead-free solder composition is electroplated onto the UBM, the die is subjected to a seed metallization etch, and wherein, after the seed metallization etch, the die is subjected to a further etch with a solution comprising an acid and an oxidizer, after which the solder is reflowed.

* * * * *

UNITED STATES PATENT AND TRADEMARK OFFICE
CERTIFICATE OF CORRECTION

PATENT NO. : 6,780,751 B2
DATED : August 24, 2004
INVENTOR(S) : Fay, Owen

It is certified that error appears in the above-identified patent and that said Letters Patent is hereby corrected as shown below:

Column 8,
Line 15, please delete "Bolder" and insert therefor -- solder --.
Line 62, please delete "TLW" and insert therefor -- TiW --.

Signed and Sealed this

Fourteenth Day of December, 2004

JON W. DUDAS
*Director of the United States Patent and Trademark Office*